US010051758B2

(12) United States Patent
Hofmann et al.

(10) Patent No.: US 10,051,758 B2
(45) Date of Patent: Aug. 14, 2018

(54) CHASSIS WITH LOW-COST, TOOL-LESS FASTENING MECHANISMS FOR RACK MOUNT SYSTEMS

(71) Applicant: Oracle International Corporation, Redwood City, CA (US)

(72) Inventors: Andres Gabriel Hofmann, Poway, CA (US); Eric Munro Innes, San Diego, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 91 days.

(21) Appl. No.: 15/259,449

(22) Filed: Sep. 8, 2016

(65) Prior Publication Data
US 2018/0070469 A1    Mar. 8, 2018

(51) Int. Cl.
*H05K 7/14* (2006.01)
*A47B 57/34* (2006.01)

(52) U.S. Cl.
CPC .......... *H05K 7/1489* (2013.01); *A47B 57/34* (2013.01)

(58) Field of Classification Search
CPC ....... H05K 7/1489; H05K 7/186; A47B 57/34
See application file for complete search history.

(56) References Cited

U.S. PATENT DOCUMENTS

| | | | | |
|---|---|---|---|---|
| 5,209,356 A * | 5/1993 | Chaffee | ............... | A47B 81/064 |
| | | | | 211/26 |
| 5,394,305 A * | 2/1995 | Moral | ................. | H05K 7/1425 |
| | | | | 211/41.17 |
| 5,912,801 A * | 6/1999 | Roy | .................... | H05K 7/1418 |
| | | | | 312/223.1 |
| 6,273,534 B1 * | 8/2001 | Bueley | ................ | A47B 46/005 |
| | | | | 211/187 |
| 6,349,041 B1 * | 2/2002 | Hayward | ............. | H05K 7/1425 |
| | | | | 174/365 |
| 6,926,378 B2 * | 8/2005 | Greenwald | .......... | H05K 7/1421 |
| | | | | 312/223.1 |
| 6,930,886 B2 * | 8/2005 | Velez | ................... | H05K 7/1489 |
| | | | | 211/187 |
| 6,940,730 B1 * | 9/2005 | Berg, Jr. | ................. | H04Q 1/10 |
| | | | | 174/383 |

(Continued)

*Primary Examiner* — Stanton L Krycinski
(74) *Attorney, Agent, or Firm* — Marsh Fischmann & Breyfogle LLP; Kent A. Lembke

(57) ABSTRACT

A rack-mountable system is provided that includes fastening mechanisms mounted to the chassis sidewalls. The fastening mechanisms or "ears" of a rack-mountable chassis are each provided as a unitary part or piece rather than as multiple sheet metal or cast/extruded metallic parts that have to be assembled. The ear is attached or mounted to the chassis in a tool-less manner through specific design of the ear and its chassis-locking features and of holes and/or receiving/mating surfaces and/or openings on the chassis sidewalls. The left and right (or first and second) ears are manufactured in a number of ways including 3D printing, casting, and molding in a shock and impact-resistant material, such as a plastic (e.g., a thermoplastic). The chassis with the low-cost, tool-less ears are useful for mounting routers, switches, servers, digital data storage units, and instrumentation in a rack (e.g., a conventional enclosure for computer and telecommunications equipment).

20 Claims, 14 Drawing Sheets

(56) References Cited

U.S. PATENT DOCUMENTS

| | | | |
|---|---|---|---|
| 7,086,539 B2* | 8/2006 | Knudsen | G02B 6/4452 |
| | | | 211/26 |
| 7,245,717 B2* | 7/2007 | Fritz | H04B 1/08 |
| | | | 361/752 |
| 7,255,409 B2* | 8/2007 | Hu | A47B 88/43 |
| | | | 211/26 |
| 7,301,756 B2* | 11/2007 | Wayman | H05K 7/1489 |
| | | | 361/679.01 |
| 7,388,754 B2* | 6/2008 | Chen | H05K 7/1489 |
| | | | 312/223.1 |
| 7,661,775 B2* | 2/2010 | Sun | H05K 7/1408 |
| | | | 312/216 |
| 7,857,145 B2* | 12/2010 | Mushan | A47B 88/43 |
| | | | 211/26 |
| 7,950,753 B2* | 5/2011 | Liang | A47B 88/43 |
| | | | 211/26 |
| 8,014,826 B2* | 9/2011 | Baldwin | H05K 7/186 |
| | | | 361/679.33 |
| 8,322,668 B2* | 12/2012 | Tang | H05K 7/1489 |
| | | | 211/175 |
| 8,418,972 B2* | 4/2013 | Iizuka | H05K 7/1489 |
| | | | 248/49 |
| 8,737,078 B2* | 5/2014 | Zhang | H05K 5/0221 |
| | | | 312/223.1 |
| 8,800,787 B2* | 8/2014 | Lohman | H05K 7/1415 |
| | | | 211/26 |
| 9,229,492 B2* | 1/2016 | Henderson | G06F 1/181 |
| 9,795,052 B2* | 10/2017 | Hsiao | H05K 7/1488 |
| 2006/0119239 A1* | 6/2006 | Werwick | A47B 47/0008 |
| | | | 312/334.29 |
| 2012/0292274 A1* | 11/2012 | Lin | A47B 88/43 |
| | | | 211/86.01 |
| 2016/0242307 A1* | 8/2016 | Qi | H05K 7/1489 |

\* cited by examiner

CHASSIS WITH LOW-COST, TOOL-LESS FASTENING MECHANISMS FOR RACK MOUNT SYSTEMS

BACKGROUND

1. Field of the Invention

The present invention generally relates to mounting of servers and other computer equipment, telecommunications equipment, and electronics in standard enclosures (simply called "racks" herein) that may include enclosures (or cabinets), wallmounts, server racks, and so on, and, more particularly, to chassis adapted for mounting in a rack (e.g., a server rack when the chassis contains one or more servers) with the chassis including low-cost, tool-less fastening mechanisms or assemblies on either side (e.g., left and right (or first and second) ears or ear assemblies) that allow attachment or mounting of the chassis to the rails of the rack.

2. Relevant Background

There are numerous settings or environments where electronic equipment, computers and computer equipment (e.g., servers, routers, and so on), and telecommunications equipment is provided in a centralized location in standard or conventional enclosures. Often, this equipment is provided within a box or chassis that is then mounted within the enclosure such as with the chassis including fastening mechanisms or ears on its left and right sides that are adapted for mounting the chassis to the rails of a rack. Such use of racks can be found in data centers, computer rooms, network rooms, control rooms, telecommunication centers, and so on.

As a specific example, servers and other computing devices are often stored in racks. Each of these racks may contain numerous servers in a stacked arrangement. For example, a server rack may house 5 to 10 or more servers. Each server is typically mounted within the storage rack using a rail, slide, or rack-mount kit. A rail kit typically includes a pair of outer rail assemblies, each of which is attached to front and rear vertical support members or pillars (e.g., Radio Electronics Television Manufacturers Association ("RETMA") rails) of the storage rack frame and extends horizontally to define a server mounting location within the storage rack or cabinet. Generally, a storage rack includes a pair of front pillars adjacent a front door or opening of the storage rack and a pair of rear pillars spaced from the front pillars, where a rear door or opening of the storage rack is typically spaced from the rear pillars (e.g., so that a space or gap exists between the rear door/opening and the rear pillars of the storage rack). The spacing between the pillars is typically a standard width such as may be the case for a server rack meeting the EIA-310 (where "EIA" stands for Electronic Industries Association) or similar standard, and the configuration of fastening elements (or left and right fastening mechanisms or ears on a chassis) for mating with these pillars or the rails is defined by these standards (e.g., by number and spacing of holes for receiving fasteners used to mount the chassis to the pillars/rails). For example, to mount a server (or other computer, electronics, or telecommunication device(s)) in the rack, the server(s) is placed in a chassis (e.g., metal, such as sheet metal, box) and a pair of inner or rack rails is attached to an outer surface of the server chassis.

Industry dictates that enterprise-level datacenter hardware is to be designed to be rack mountable. In order to meet this dictate or requirement, most of the hardware will require a specific set of mechanical features. With regard to a server and other chassis, left and right (or first and second) fastening mechanisms or ears are provided on each chassis with a particular set of mechanical features for mating with one or more standard racks, and these features may include a particular number and size of fastener holes with a specific hole spacing.

Historically, a system (or chassis) that had to be rack mounted used various relatively expensive combinations of sheet metal parts, cast metallic parts, and/or machined metallic parts to provide the two fastening mechanisms or ears. The cost of fabrication of these multi-part ears is increased due to post-processing of its parts using expensive paints and, in some cases, anodizing processes. Typically, prior to shipping the chassis, the ears are attached to the chassis through the use of screws and rivets, which adds to the number of parts required to provide the rack-mountable chassis and requires two or more specific tools and which adds to the material (fastener costs) and fabrication costs (labor costs) for the chassis.

SUMMARY

Briefly, the inventors recognized that the fastening mechanisms or "ears" of a rack-mountable chassis can each be provided with a unitary part or piece rather than multiple sheet metal or cast/extruded metallic parts that have to be assembled. Further, the ear can be attached or mounted to the chassis in a tool-less manner through specific design of the ear and its chassis-locking features or elements and of holes and/or receiving/mating surfaces and/or openings on the chassis walls. The left and right (or first and second) ears can be manufactured in a number of ways including 3D printing, casting, and molding in a shock and impact-resistant material, such as a plastic (e.g., a thermoplastic), using the 3D definition of the ears (e.g., 3D CAD geometry defining the dimensions of each ear). The chassis with the low-cost, tool-less ears (or fastening mechanisms) can be used in nearly any rack-mountable system such as for mounting routers, switches, servers, digital data storage units, instrumentation, and the like in a rack (with the term "rack" intended to include any number of conventional enclosures including cabinets, racks, and the like).

The new chassis and ear design provides a number of advantages over prior chassis mounting techniques. Industry presently uses machined, extruded, and cast metal parts to fabricate the fastening mechanisms or ears for a rack-mountable chassis, and the present solution uses an ear that can be fabricated using low-cost injection molding using thermoplastics or other materials. The industry practice now is to use screws and rivets to attach the metallic brackets or ears onto the chassis at the factory, whereas the present solution provide ears that can be snapped on by means of cleverly engineered molded-in features combined with a new chassis wall design. Prior ears or brackets were designed using a multi-part approach, but the new ears are each a single or unitary part that gets installed quickly while improving reliability. No painting or further post-processing treatments are needed as the new ears have a color that is provided by the choice of the thermoplastic resin (or other source material) that is injection molded. The ear and chassis wall design makes this solution easy to use and install. The steps, tools, and time required to install this part are greatly improved by an order of magnitude or more relative to any prior metal-based rack-mountable chassis. Further, the new rack-mountable chassis minimizes reliability and quality issues by reducing the number of parts in the overall mechanical assembly.

More particularly, a system or apparatus is provided for mounting in a rack used to store computer, telecommunications, electronic, and other equipment. The apparatus includes a chassis including a first sidewall and a second sidewall (e.g., left and right or opposite walls formed of sheet metal). The apparatus also includes a first rack-mounting ear coupled with the first sidewall and a second rack-mounting ear coupled with the second sidewall. The first and second rack-mounting ears each includes a body with a pair of spaced apart fastener holes for mounting the chassis to the rack. The body is fabricated as a unitary piece such as of a plastic (e.g., a thermoplastic) using injection molding. The first and second rack-mounting ears are coupled to the first and second sidewalls, respectively, in a tool-less manner without use of separate fasteners.

In some embodiments, the body includes an upper locking element with at least one wing (or arm) portion and at least one recessed portion adjacent the wing portion. The wing portion includes a center member extending outward from a surface of the body and a pair of extension members extending outward from opposite sides of the center member, with each of the extension members being spaced apart from the surface of the body by a gap. The wing portion has a width that is greater than a width of the recessed portion due to these extension members (or cantilevered members). The first and second sidewalls each includes an upper hole for receiving one of the upper locking elements when the first and second rack-mounting ears are coupled with the first and second sidewalls of the chassis. The upper hole includes at least one wing-receiving portion and, adjacent the wing-receiving portion, a pair of inward-extending portions (or teeth). The wing-receiving portion (or wider part of the upper hole) has a first width greater than the width of the wing portion of the upper locking element, and the pair of inward-extending portions define a space within the upper hole (or narrower part of the upper hole) with a second width less than the first width. The pair of inward-extending portions are positioned within the gaps between the surface of the body and the extension members when the ear and sidewall are assembled together, whereby motion of the upper locking element is restrained.

In the same or other embodiments, the body includes a first lower locking element extending outward a distance from a surface of the body. The first and second sidewalls of the chassis each includes a lower hole for receiving one of the first lower locking elements when the first and second rack-mounting ears are coupled with the first and second sidewalls of the chassis. The first lower locking element includes a lower portion with a sloped outer surface and an upper portion with a lip for abutting a retaining edge of the lower hole when the first lower locking element is placed into the lower hole, whereby motion of the first lower locking element is restrained in a direction toward the retaining edge. The body further includes a second lower locking element that is a tab extending outward from an end of the surface of the body. Each of the first and second sidewalls of the chassis further includes a retaining wall extending over the lower hole and being spaced apart from the lower hole. As part of ear and chassis sidewall assembly, the tab is inserted into a space between the retaining wall and the lower hole, whereby motion of the second lower locking element in a direction away from the lower hole is restrained by the retaining wall.

DETAILED DESCRIPTION

The present description is directed toward a rack-mountable apparatus or system that includes a combination of left and right (or first and second) rack fastening mechanisms (or "ears") and a chassis with its sidewalls adapted for receiving the ears to facilitate tool-less attachment of the ears to the chassis (to "snap on" the ears). The chassis and ears can then be mounted as a unit to a conventional rack (e.g., a standard server (or other computer, electronics, or telecommunications equipment) rack, or enclosure or cabinet, or the like). The ears are typically formed, such as using molding (e.g., injection molding), 3D printing, or other techniques, of a shock and impact resistant material such as a plastic (e.g., a thermoplastic). The cost is greatly reduced relative to prior rack-mountable systems that utilized metallic brackets or ears because with the new rack-mountable system there is no need for fasteners to attach the ears to the chassis sidewalls such that there are fewer parts and less assembly time which reduces manufacturing, material, and assembly costs. Additionally, since there are fewer parts, there are fewer points of failure in the new rack-mountable system design.

The ears each include one, two, three, or more locking (or snap-on) features or elements that may be labeled in one embodiment as an upper locking element (or feature) and lower locking elements (or features) while the left and right sidewalls of the chassis include corresponding holes or surfaces for receiving and mating with the upper and lower locking elements. During assembly, the ears are snapped on or locked in place on the chassis such that the chassis and ears become one piece or a unitary rack-mountable system. The movement of the ears is restrained in six degrees of freedom (DOF) (i.e., restrained n three rotational DOF and three translation DOF), with each of the two locking elements restraining movement of the ear in one or more of the six DOF.

Figure 1:
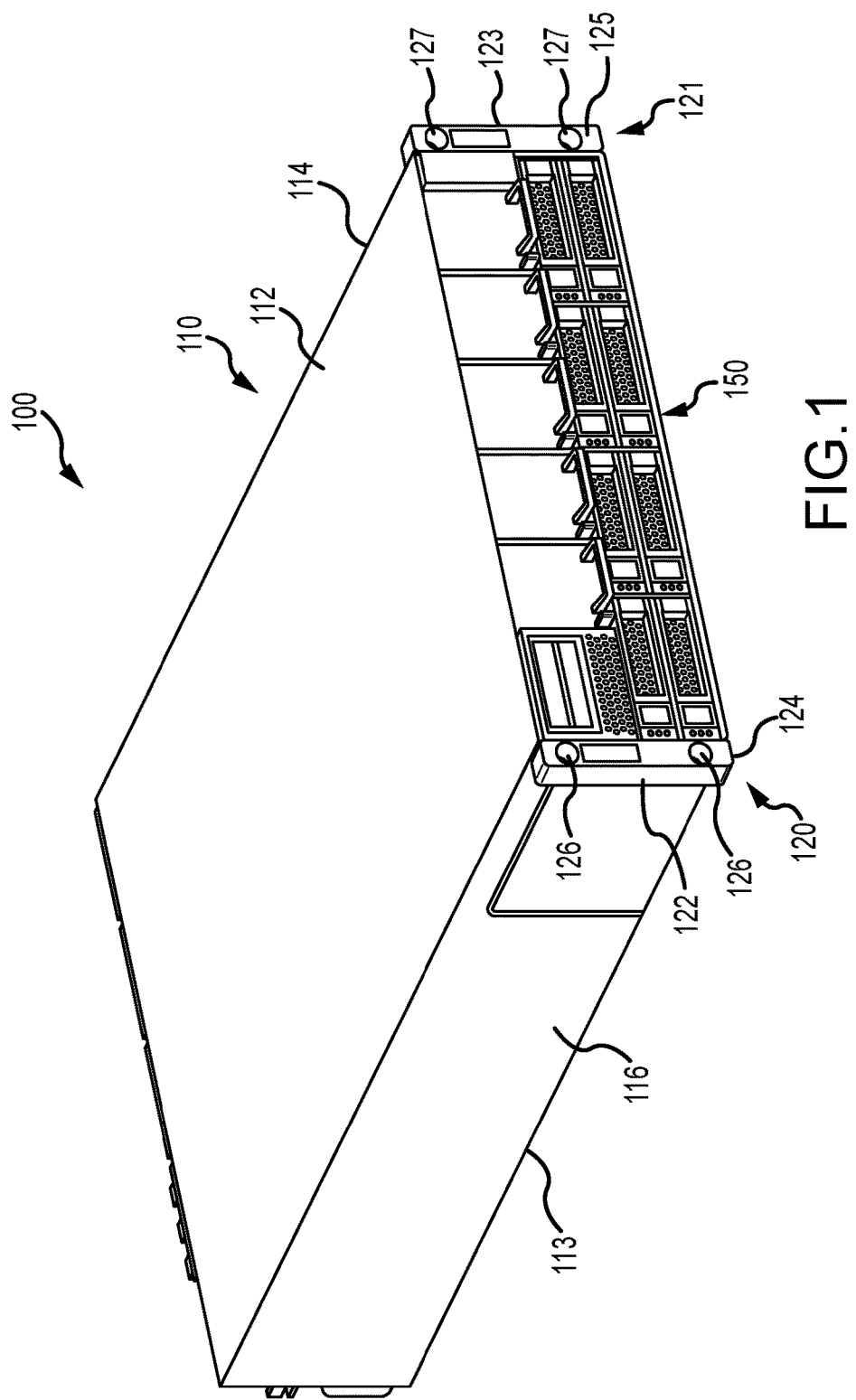
FIG. 1 illustrates a front perspective view of a rack-mountable apparatus or system of the present description including a chassis with a pair of snap-on rack ears.

FIG. 1 illustrates a perspective view of a rack-mountable apparatus or system 100 of the present description. The rack-mountable system 100 includes a chassis 110 containing equipment (e.g., one or more servers, routers, or the like) 150 within its interior space. This space is defined by a top cover/plate 112, a bottom or base plate 113, and left and right (or first and second) sidewalls 114, 116, and the size of the chassis 110 is elected for mounting within a conventional rack (e.g., see FIG. 2) such as with a particular width, height, and depth (or length) to fit between adjacent pillars of a conventionally-sized rack.

The rack-mountable system 100 further includes first and second (or right and left) ears (or rack fastening mechanisms) 120, 121. These ears 120, 121 are affixed or snapped onto the sidewalls 116, 114, respectively, of the chassis 110, and the details of how this snap on or tool-less mating is achieved is explained in further detail beginning with FIG. 3. The ears 120, 121 include a rectangular body 122, 123 with a front side or face 124, 125 in which a pair of spaced apart holes (e.g., countersunk holes) 126, 127 are provided for receiving fasteners to mount the rack-mountable system 100 to a rack. The spacing of the holes 126, 127 is chosen to match a standard spacing for a particular rack. As shown, the ears 120, 121 are mounted on an end of the sidewalls 116, 114, respectively, so that the front side or faces 124 and 125 are adjacent or co-planar with the open end (access port for equipment 150) of the chassis 110 between the sidewalls 114, 116.

Figure 2:
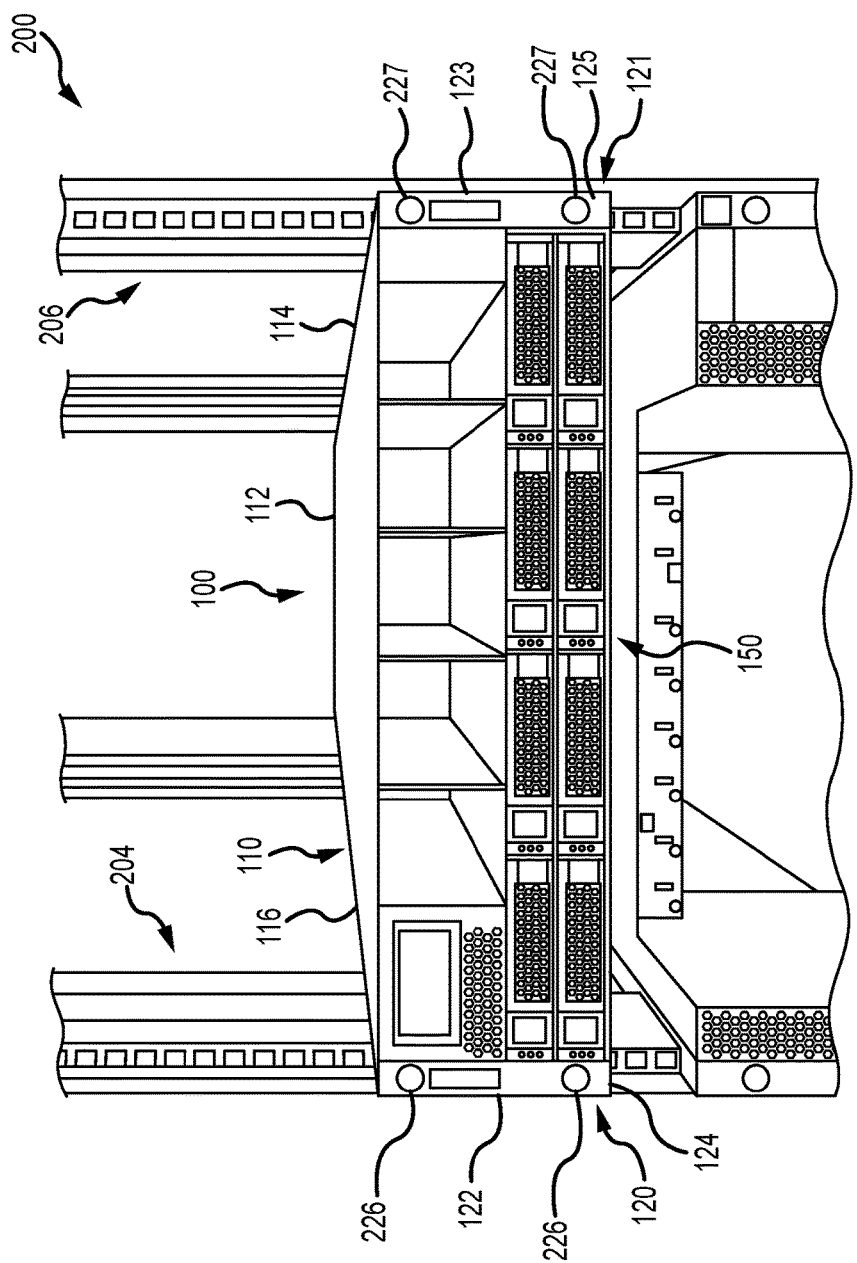
FIG. 2 illustrates the rack-mountable apparatus or system of FIG. 1 after installation in a conventional rack.

FIG. 2 illustrates a rack 200 in which the rack-mountable system 100 has been mounted. As shown, the chassis 110 has been positioned between a pair of adjacent pillars 204, 206 of the rack 200 such that the first ear 120 extends over pillar 204 and second ear 121 extends over pillar 206. Fasteners (e.g., screws) 226, 227 are inserted into the holes 126, 127 of the bodies 122, 123 of the ears 120, 121 to affix or mount the rack-mountable system 100 within the rack 200 (along with nuts or the like not shown opposite the holes 126, 127 for mating with the fasteners 226, 227). In this regard, the rack-mountable system 100 is configured for use with a conventional rack 200 similar to prior systems with metal/metallic mounting brackets or rack fastening mechanisms, but the ears 120, 121 are unitary or one-piece devices which can be formed of plastic (without the need for assembly) and that can be attached to the chassis sidewalls 114, 116 without the need for tools (e.g., snapped on).

Figure 3:
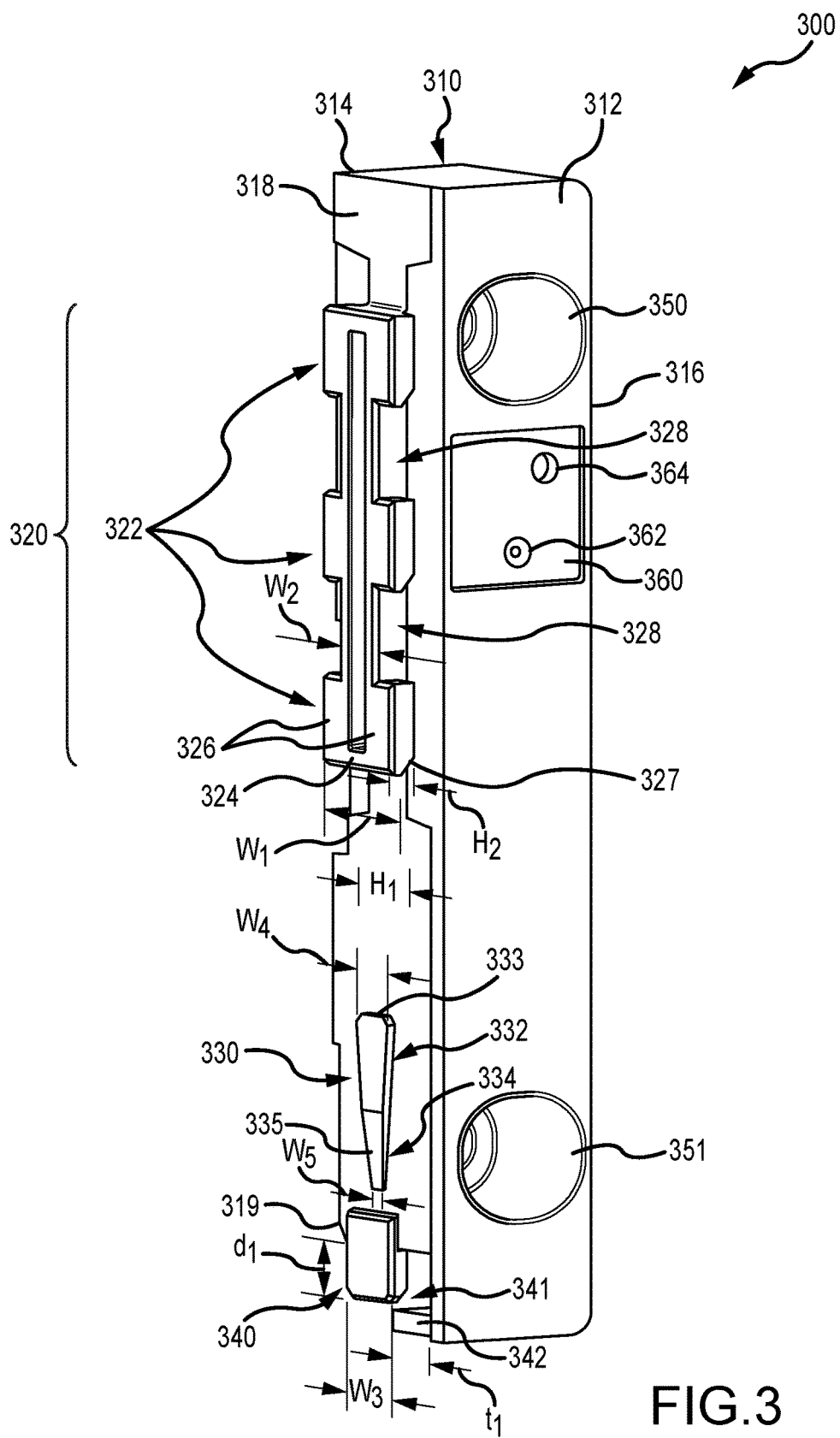
FIGS. 3 and 4 illustrate perspective views of a rack fastening mechanism or ear showing, respectively, the inner or mating surface of the ear and opposite surfaces of the ear.
Figure 4:
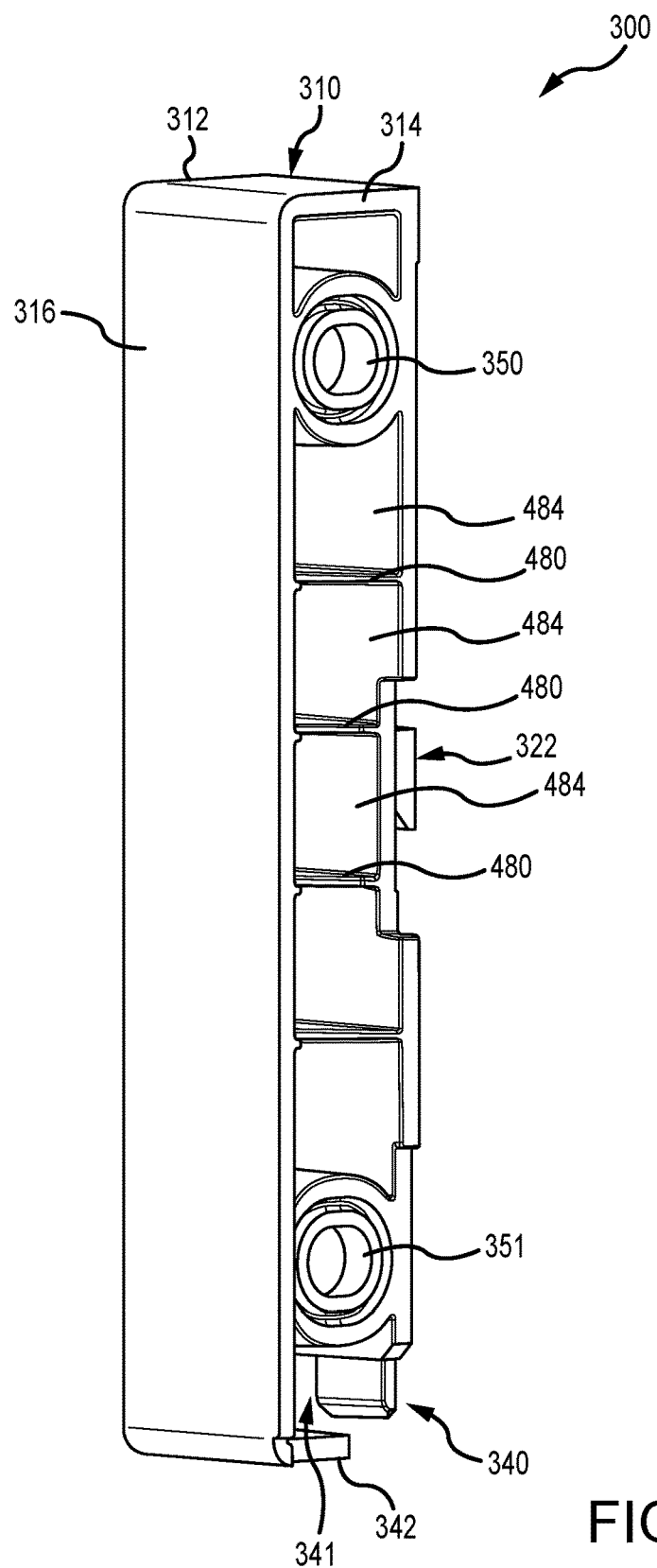

FIGS. 3 and 4 illustrate perspective views of a rack fastening mechanism or ear 300 showing, respectively, the inner or mating surface of the ear 300 and opposite surfaces of the ear 300. The ear 300 includes a body 310 that is a unitary or single piece in preferred embodiments, and the body 310 may be formed of a material that is shock and impact resistant such as a plastic (e.g., a thermoplastic). The choice of material for the body 310 is relatively important as racks assembled with the rack-mountable systems including the ear 300 undergo significant shock and impact as the racks are shipped and moved (e.g., forklifted, placed on pallets that are moved around, rolled around on dollies, and so on) causing vibration and impact/shock on the assembled components, and it is desirable that the ear 300 does not crack or otherwise become damaged in an assembled rack. To this end, it is believed a thermoplastic, such as a polycarbonate (e.g., Lexan 920 or the like), that is suited for injection molding of the body 310 would be desirable. The use of a plastic also allows the color of the body 310 to be set during fabrication (e.g., molding with a plastic resin) such that additional post-fabrication processing is not required (e.g., no painting required). In some embodiments, the plastic resin color is an alloy silver or other color chosen to match or suit the chassis (and its metallic coloring).

The body 310 may be generally rectangular in shape as shown with a first (or outer) side/surface 312 that typically faces outward and is accessible via the rack's opening or access port. The surface/side 312 includes spaced apart holes 350, 351 for allowing a pair of fasteners to be passed through the body 310 to attach the body 310 to a rack (e.g., to a pillar). The surface/side 312 also includes a recessed surface 360 for receiving a label or ID element (e.g., an RFID tag or the like not shown in FIG. 3) with the hole 362 for receiving a fastener and the through hole 364 provided for facilitating later removal of the logo/ID element from the body 310. A second (or inner) side/surface 314 of the body 310 opposite the first surface 312 includes back sides of fastener holes 350, 351 (countersunk holes bored through the body 310) in which nuts or other fasteners may be provided to affix a fastener passed from the first side 312 in the holes 350, 351 to a rack (e.g., a rack's pillar), and the second side/surface 314 faces into the rack. As shown in FIG. 4, the body 310 is typically formed to be hollow except for the outer shells/walls forming the sides 312, 314, 316, 318 of the body 310, and the second side 314 shows this aspect of the body 310 with ribbing (or spaced apart ribs) 480 defining voids 484 in the body 310, which are useful to limit the amount of material required to form the ear 300 and to facilitate molding of the ear 300. The body 310 includes a third side/surface 316 that may be planar and faces away from the chassis after assembly. The body 310 further includes a fourth or chassis-facing (or chassis-mating) side/surface 318, which upon assembly abuts the outer side/surface of the chassis wall and which includes the locking or snap-on elements of the ear 300.

The locking or snap-on features/elements include upper locking element 320 and first and second lower locking elements 330 and 340. A goal of the use of the locking elements 320, 330, and 340 along with the receiving/mating components or elements on the chassis wall (explained below beginning with FIG. 7) is to create a rack-mountable apparatus or system that behaves as if it were a single piece or moves as a unit. To this end, the locking elements 320, 330, and 340 along with the receiving/mating elements of the chassis wall are configured to restrain movement of the snapped on or locked in ear 300 in six DOF (three rotation DOF and three translational DOF), and each locking element 320, 330, and 340 acts to restrain movement of the ear 300 relative to the chassis in one or more of the six DOF.

The upper locking element 320 has a body that extends a first height, $H_1$, from the side/surface 318 of the ear body 310, and the body is made up of three wings or arms 322 separated by recessed portions 328. Each of the wings/arms 322 includes a center member 324 integrally formed with and extending upward to the height, $H_1$, from surface/side 318 of the ear body 310. Each of the wings/arms 322 further includes a pair of extensions 326 on either side of the center member 324, and each of the extensions 326 is a cantilevered member with a second height, $H_2$, as measured from the outward facing surface of the center member 324 that is less than the first height, $H_1$. In this way, there is a gap between the lower or inner side of each extension 326 and the surface/side 318 of the ear body 310 through which a portion of the chassis sidewall may pass during assembly of the rack-mountable system (e.g., the gap has a thickness greater (by a small amount) than the thickness of the sheet metal used to fabricate the chassis sidewall) and this portion of the chassis sidewall is used, in part, to lock the locking element 320 in place against the chassis (e.g., to restrain movement in the X and Z-axes as explained below with reference to FIG. 11). To facilitate assembly by providing a guiding surface when the locking element 320 strikes edges of a receiving/mating component on a chassis sidewall, each wing or arm 322 also includes a leading edge 327 that is angled or beveled (e.g., in a range of 30 to 60 degrees or the like).

The wings/arms 322 have a first width, $W_1$, that is chosen to match (be some small amount less) a receiving/mating component (hole) in a chassis sidewall. The recessed portions 328 have a second width, $W_2$, that is less than the first width, $W_1$, such as a width that matches the width of the center member 324 of each wing/arm 322, and this width, $W_2$, may also be chosen to match a corresponding portion of a receiving/mating component (hole) in a chassis sidewall, e.g., to allow the upper locking element 320 to be received in the chassis the size and number of the wings/arms 322 and recessed portions 328 are chosen to define a pattern or outline that matches that of a receiving component/hole in the chassis wall.

The number of arms/wings 322 may be three as shown in FIG. 3 as this has proven in a prototype to be effective in restraining movement of the ear 300 when assembled within a chassis wall, but other embodiments may use one or two of the arms/wings while other embodiments may include four, five, or more of the arms/wings 322. Similarly, the size of the extensions 326 may vary to provide adequate strength and resistance to movement in this cantilevered portion, with some embodiments using extensions 326 that are at least 2 millimeters in width as measured from the center member 324 to an outer edge of the arm/wing 322 (but this may vary with the length of the extensions (e.g., these may range from 5 millimeters to 10 millimeters or more to suit a particular application)).

The locking elements of the ear 300 that are provided on ear side/surface 318 further include a pair of (or first and second) lower locking elements 330 and 340. As shown, the lower locking element 330 has a body that extends upward from the surface/side 318 and has first and second (or upper and lower) portions 332, 334. The upper portion 332 has a width, $W_4$, that is greater than the width, $W_5$, of the lower portion 334, which makes it easier to align and slide into a receiving hole (or groove/gap) in the chassis sidewall (e.g., upper groove/gap 772 in the hole 770 in the chassis sidewall 740 shown in FIG. 11). The upper portion 332 has an exposed sidewall or lip 333 that provides a mating surface or stop with the chassis sidewall (e.g., sidewall 740 and its upper groove/gap-defining edge (or inner wall) 773 again shown in FIG. 11) when the locking mechanism 330 is "snapped" or positioned within a receiving hole of a chassis sidewall (e.g., when the locking mechanism 330 is slid into the hole 770 the exposed sidewall or lip 333 snaps into an abutting engagement or into contact with the edge 773 of the hole 770, which prevents Y-axis motion (restrains movement in one DOF for the ear 300)). The lower portion 334 includes a sloped or angled outer (or outward-facing) surface 335 that engages the surfaces of the chassis sidewall, and the sloped outer surface 336 facilitates tool-less assembly of the ear 300 and chassis by reducing the friction and guiding movement downward or toward the receiving hole (e.g., hole 770).

The other or second lower locking element 340 is a tab or cantilevered member that extends outward a distance, $d_1$, past an end 319 of the side/surface 318 of the ear 300 into a space/gap 341 (gap or space between the end 310 and ledge or endwall 342 extending outward from the backside of side/surface 312 toward the side/surface 314 of the ear 300). The tab or lower locking element 340 is configured to mate with an inner surface of a retaining wall extending outward and over a portion of a receiving hole in the chassis sidewall (e.g., mate with retaining wall 780 on the chassis sidewall 740, which extends across the lower portion of the receiving hole 770 when the ear 300 and chassis sidewall 740 are assembled together). The distance, $d_1$, is chosen to provide a desired amount of surface-to-surface engagement to restrain movement of the ear 300 in one DOF (e.g., prevent lower X-axis motion), and this may be 2 to 5 millimeters or more.

Figure 11:
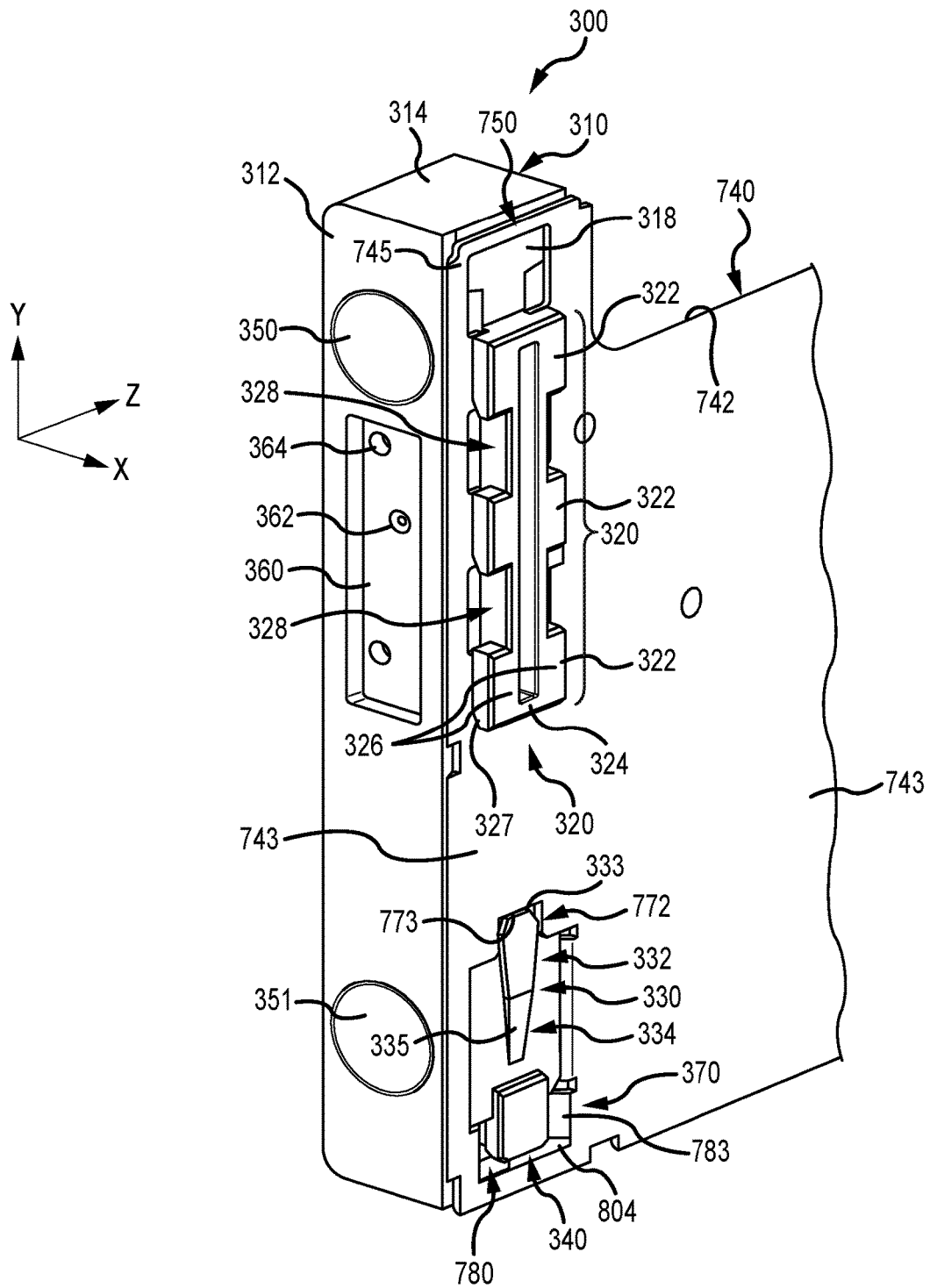
FIG. 11 illustrates a portion of a rack-mountable system after an ear has been locked into place upon a chassis sidewall.

The strength (and mating surface area) of the tab or locking element 340 is provided by making the tab/element 340 relatively thick, $t_1$, e.g., a thickness that is greater than the thickness of the side/surface 318 of the ear (or 1 to 3 millimeters or more). The mating surface area and strength of the tab/locking element 340 are further provided and/or defined by the width, $W_3$, of the tab/locking element 340, and this may be chosen to be in 3 to 5 millimeters or more in some implementations of the ear 300. The leading edge of the tab/locking element 340 may be beveled/angled as shown (such as in the range of 30 to 60 degrees such as 45 degrees) to prevent the tab from angling out or peeling off from the bottom when mating with the retaining wall on the chassis sidewall (e.g., assist in the mating with retaining wall 780 during assembly with the chassis sidewall 740 as shown in FIG. 11). The ledge or endwall 342 may be provided to mate with a portion of the chassis sidewall that defines or provides the lower edge of the hole that receives the locking elements 330, 340 (e.g., the area of the chassis sidewall 740 that extends across the bottom of the receiving hole 770 as shown in FIG. 11) to increase the structural rigidity of the ear/chassis assembly.

Figure 5:
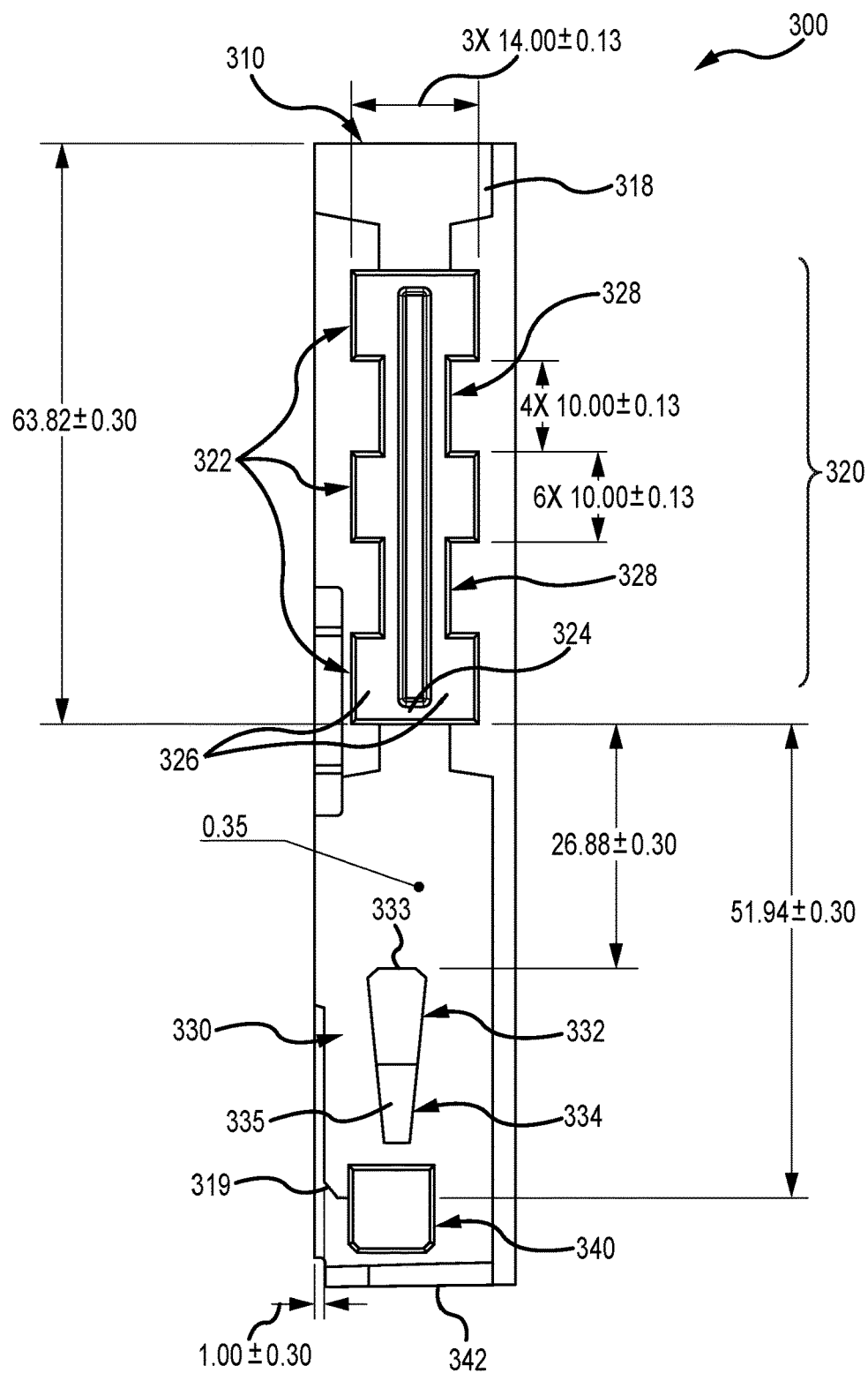
FIG. 5 is a side or plan view of the ear of FIGS. 3 and 4 showing the inner or chassis-mating surface or side of the ear showing details of the locking features or elements.
Figure 6:
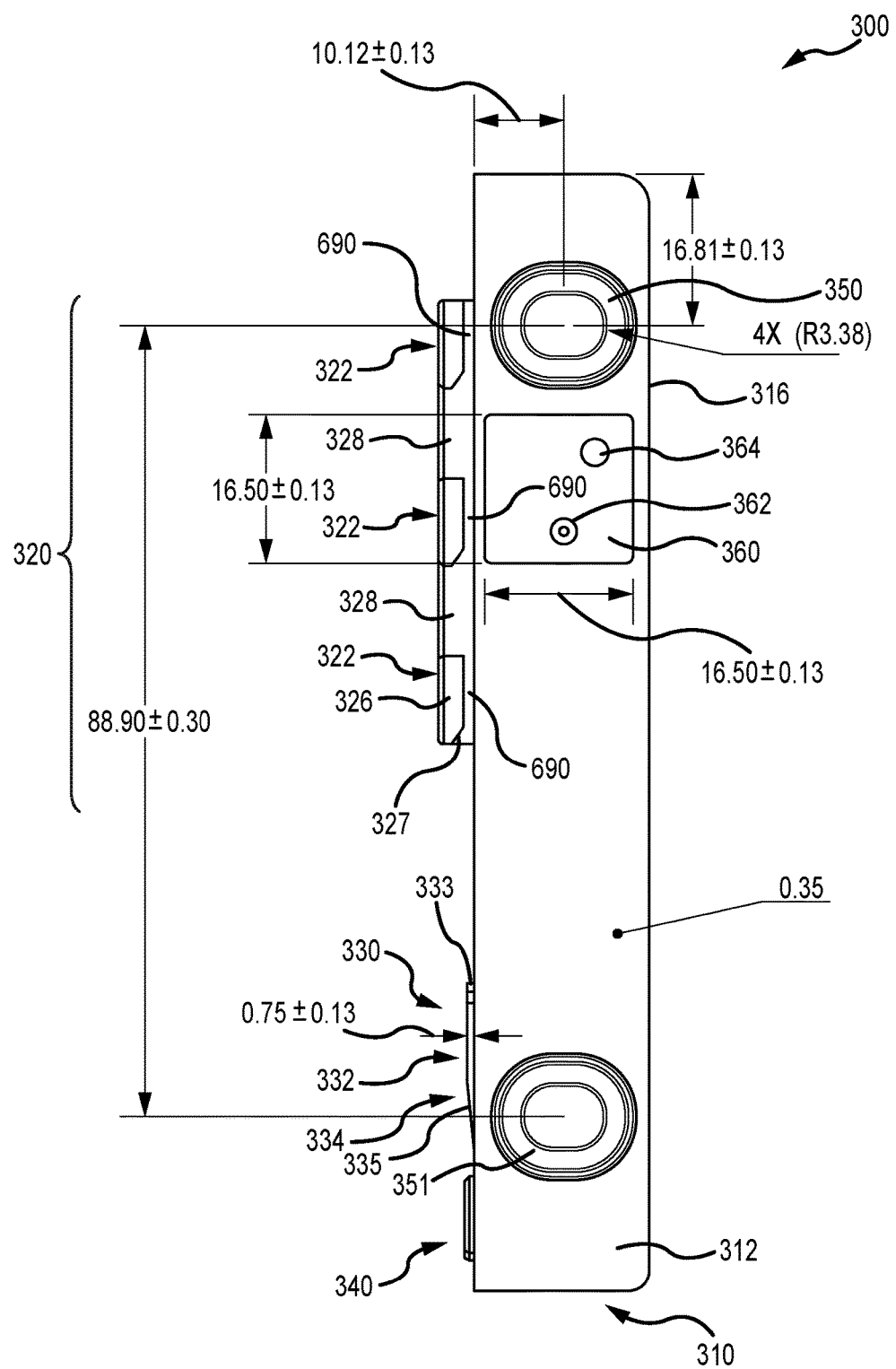
FIG. 6 is another side or plan view of the ear of FIGS. 3 and 4 showing an outer or exposed surface or side of the ear showing additional details to the locking features or elements of the ear.

FIGS. 5 and 6 illustrate side or plan views of the rack fastening mechanism or ear 300 showing, respectively, the inner or mating surface 318 of the ear and an adjacent surface or side 312 of the ear 300 (that faces outward from the rack when the ear 300 is affixed to a chassis and the chassis is mounted in a rack as shown in FIG. 2). FIGS. 5 and 6 also include dimensional data for one useful implementation of the ear 300 for use in a presently manufactured and standard rack, e.g., with conventional spacing of the holes 350, 351 at about 89 millimeters.

Figure 7:
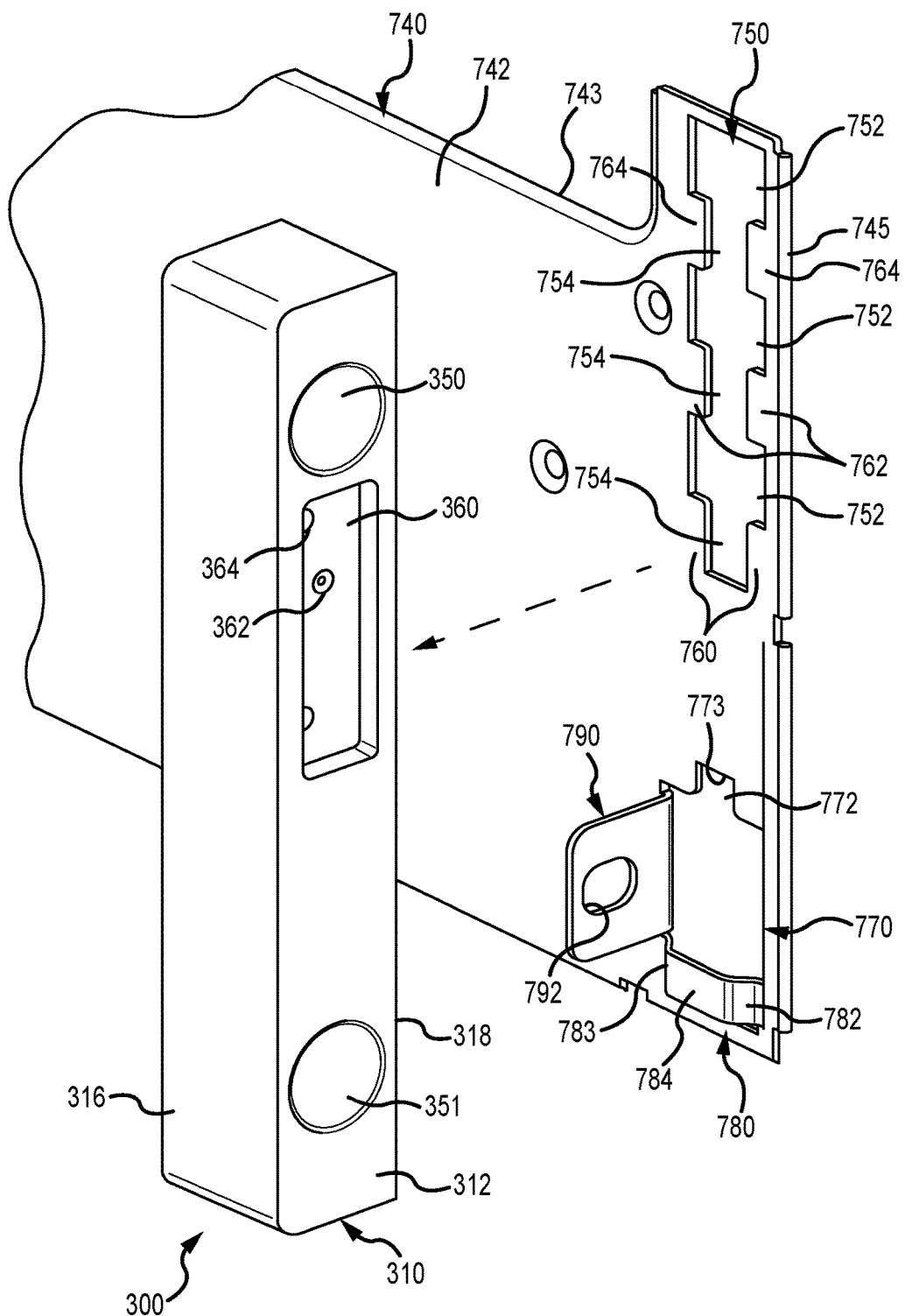
FIGS. 7-9 are partial exploded views (or pre-assembly views) of a rack-mountable system or apparatus showing details of a chassis sidewall and its features for receiving and mating (locking) with the locking elements of the rack-fastening mechanism or ear.

FIGS. 5 and 6, in addition to assisting the reader in making (such as with injection molding using a thermoplastic resin) the ear, are useful for showing the gap or clearance 690 provided between the extension or cantilevered portion 326 and the side/surface 318 of the ear 300 for each wing/arm 322 of the upper locking element 320. As discussed above, this clearance/gap 690 is provided such that during assembly of the ear 300 with a chassis that the chassis sidewall can slide underneath the extension/cantilevered member 326 until the ear 300 is locked or snapped into place (e.g., the inward-extending members or teeth 760, 762, 764 defining the inner edges of the receiving hole 750 as shown in FIG. 7 slide under and then restrain movement of the upper locking mechanism in two DOF such as by restraining X-axis and Z-axis motion). FIG. 6 also is useful for showing the ramped or beveled leading edges 327 that assist in assembly as they allow or assist the extensions 326 of each wing/arm 322 to ride over the sheet metal of the chassis sidewall after the upper locking element 320 is fit into the upper receiving hole.

Figure 8:
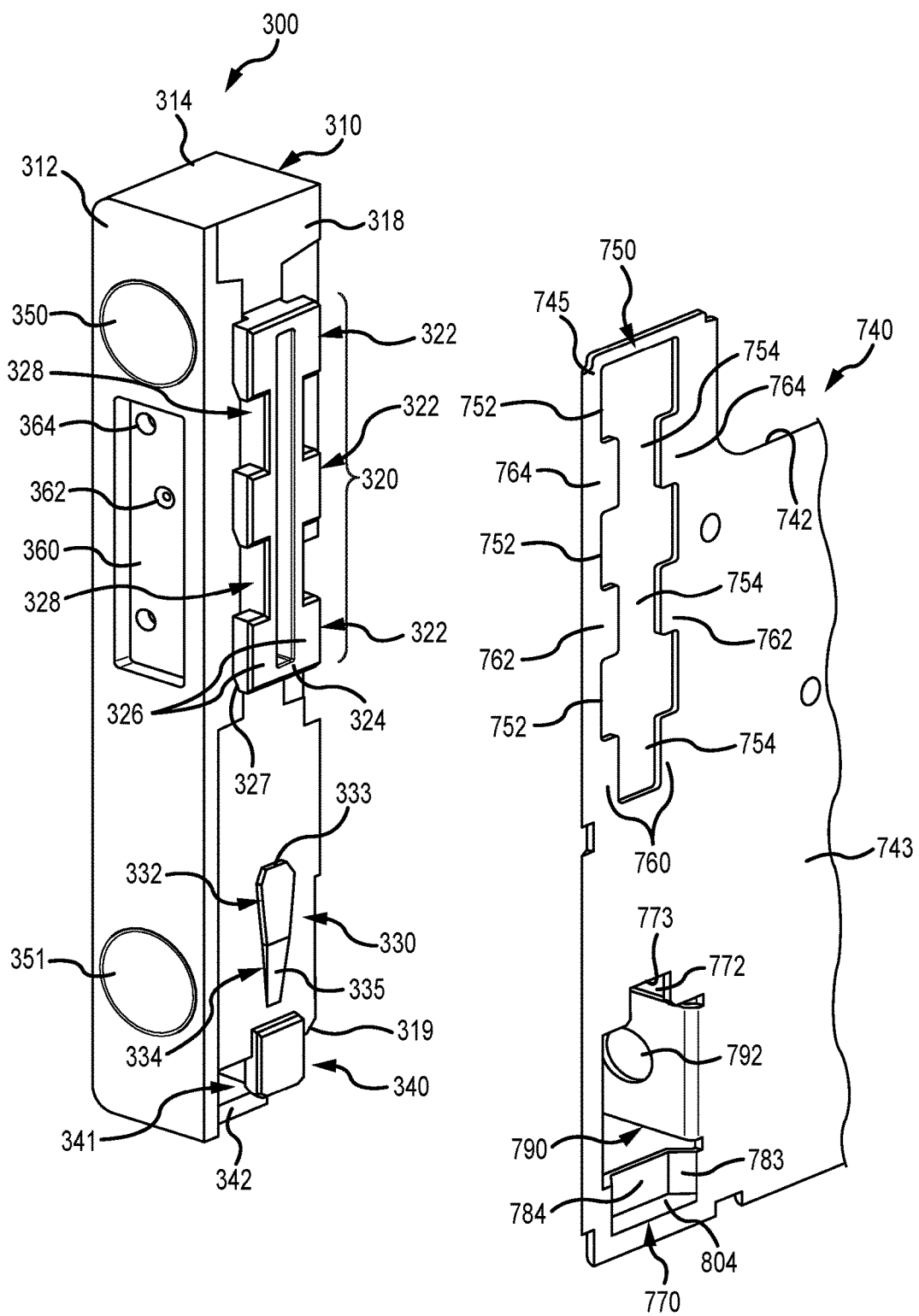
Figure 9:
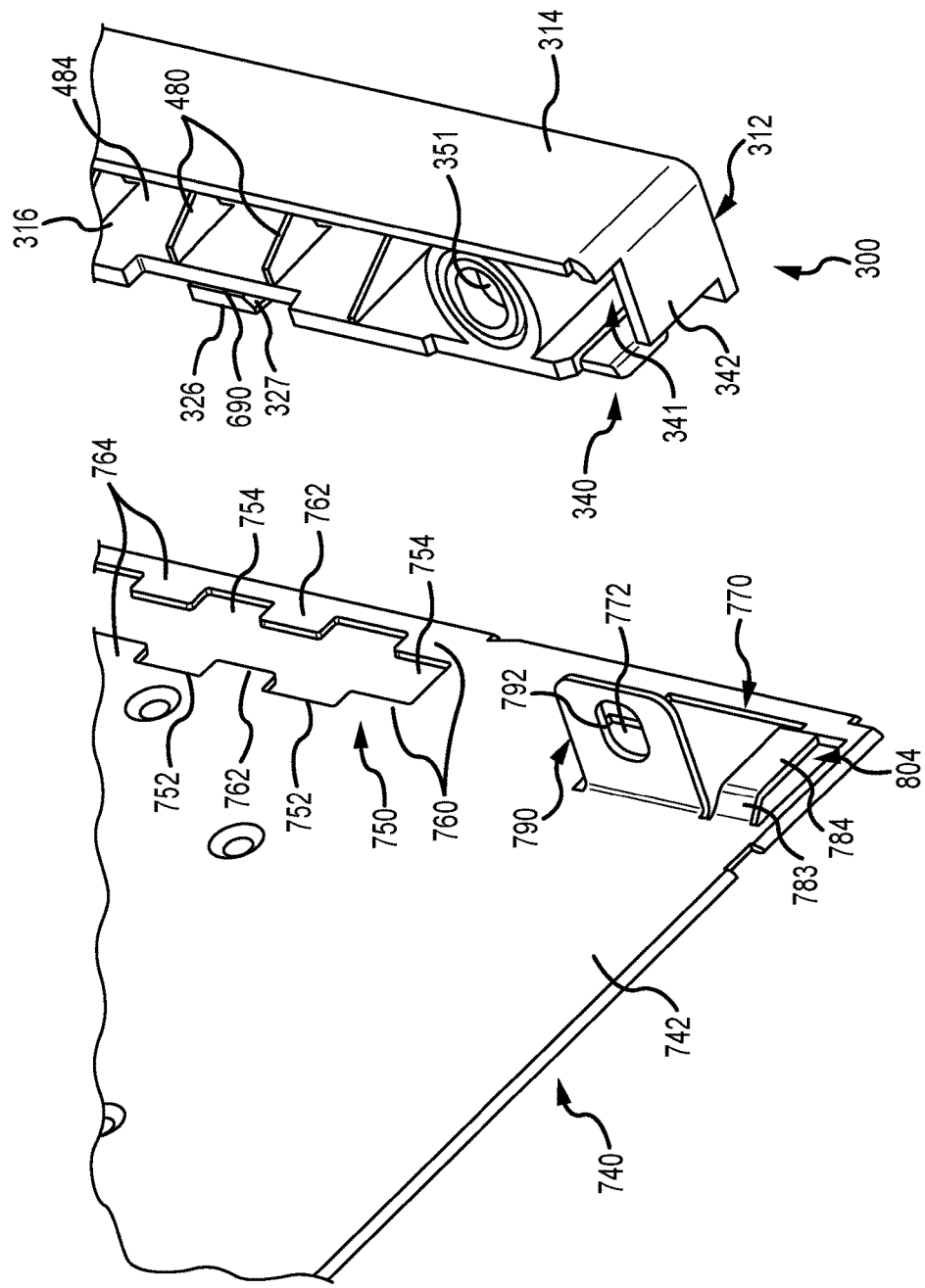

FIGS. 7-9 are partial exploded views (or pre-assembly views) of a rack-mountable system or apparatus showing details of a chassis sidewall 740 and its features for receiving and mating (locking) with the locking elements 320, 330, and 340 of the rack-fastening mechanism or ear 300 (note, for ease and clarify of explanation, the reference numbers used in FIG. 3-6 are repeated in FIGS. 7-9 even though the ear 300 in FIGS. 3-6 is a left ear (e.g., second ear 121 in FIG. 1) while the ear 300 in FIG. 7-9 is a right ear (e.g., first ear 120 in FIG. 1)). As shown, the chassis sidewall 740, which may be formed of sheet metal, has an outer surface 742 and an inner surface 743 (which, in part, defines the inner space of the chassis that includes the sidewall 740).

At an end 745 of the sidewall 740 (e.g., the end of the chassis that will be mounted to pillars of a rack), the sidewall 740 has receiving and mating (locking) features including: an upper hole 750; a lower hole 770; a retaining wall 780; and a support bracket 790. The upper hole 750 is configured for receiving and then retaining the upper locking element 320 of the ear 300 upon assembly of the ear 300 and chassis wall 740. To this end, the upper hole 750 includes three receiving portions or spaces/gaps 752 for receiving the larger portions of the upper locking element 320, i.e., the three wings or arms 322. The wing/arm-receiving portions 752 are provided by edges cut or formed in the sheet metal of the sidewall 740 that define a pattern that matches the shape and size of the wings/arms 322 (e.g., with a width and height that is a small amount larger than these dimensions of the wings/arms 322).

The wing/arm-receiving portions 752 of the hole 750 are spaced apart by pairs of teeth or inward-extending members 762 and 764 while a third pair of teeth or inward-extending members 760 are provided below the lowest or bottom wing/arm-receiving portion 752. In this way, the teeth/inward-extending members 760, 762, 764 act as restraining or locking features as they restrain movement of the ear 300 after they are slid into place below each of the three wings/arms 322 of the upper locking element 320. The spaces/gaps 754 between the teeth pairs 760, 762, 764 is sized to be a small amount greater than the width, $W_2$, of recessed portions 328 of the upper locking element 320 to allow the locking element 320 to be received and then locked in place on the chassis sidewall 740.

The lower hole 770 is sized and shaped (by edges cut into or formed in the sheet metal of the chassis sidewall 740) for receiving both of the lower locking elements 330 and 340 of the ear 300. To restrain further movement once placed within the hole 770, the hole 770 includes an upper gap or space 772 that is narrower than the rest or lower portion of the hole 770 and is sized and shaped for receiving and then restraining movement of the lower locking element 330. Particularly, the gap 772 has a width that is only a small amount greater than the width, $W_4$, of the upper portion 332 of the lower locking element 330, and the gap 772 is defined in part by an edge 773 that is located on the sidewall 740 such that, when the ear 300 is slid into place with the upper locking element 320 inserted into the upper hole 750 in the sidewall 740, the lip 333 of the upper portion 332 of the lower locking element 330 snaps or moves into hole 770 and the lip 333 abuts or contacts the edge 773, which restrains movement of the locking element 330 and ear 300 (i.e., resists movement back in the direction used to assemble the two parts or prevents Y-axis motion and the side edges of the gap 772 may also resist Z-axis motion).

The locking features of the chassis sidewall 740 also include a retaining wall/member 780. As can be seen in FIGS. 7-9, the retaining wall 780 generally is U-shaped with a pair of angled portions 782, 783 extending outward from the surface 742 of the chassis sidewall 740 adjacent (immediately adjacent in some cases as shown) and a middle or center portion 784 extending between the angled portion 782, 783. The middle or center portion 784 may be a planar member (e.g., a rectangular piece of sheet metal) that is parallel to the surface 742 of the chassis sidewall 740, and the middle or center portion 784 is spaced apart from the surface 742 a predefined distance to receive and then abuttingly engage the tab/cantilevered lower locking element 340. For example, the middle or center portion 784 may be spaced apart from the surface 742 by a distance that is about the thickness, $t_1$, of the tab/lower locking element 340. When the tab/lower locking element 340 is fit into place between the retaining wall 780 and the surface 742 of the chassis sidewall 740 in the gap 804 (see FIG. 8), the retaining wall 780 acts to restrain its movement (e.g., prevents/minimizes lower X-axis motion of the ear 300).

The locking features of the chassis sidewall 740 further include a support bracket 790 that extends outward from an inner edge of the hole 770. The bracket 790 may be positioned relative to a received ear 300 so that a hole 792 in the bracket 790 is aligned with the lower fastener hole 351 of the ear 300 (e.g., to provide access to a nut or other fastener element). The bracket 790 may be oriented to be orthogonal to the planar surface 742 of the chassis sidewall 740 so that its surface facing the front edge 745 of the sidewall 740 can better mate with the side/surface 360 of the ear 300. The bracket 790 may be formed from material removed from the sidewall 740 to form a portion of the hole 770, and, as a result, the size and shape of the bracket 790 may generally match the hole 770 (e.g., be rectangular as shown with rounded corners formed for safety of workers assembling the ear 300 and sidewall 740 and to otherwise facilitate assembly of the rack-mountable system or apparatus).

Figure 10A:
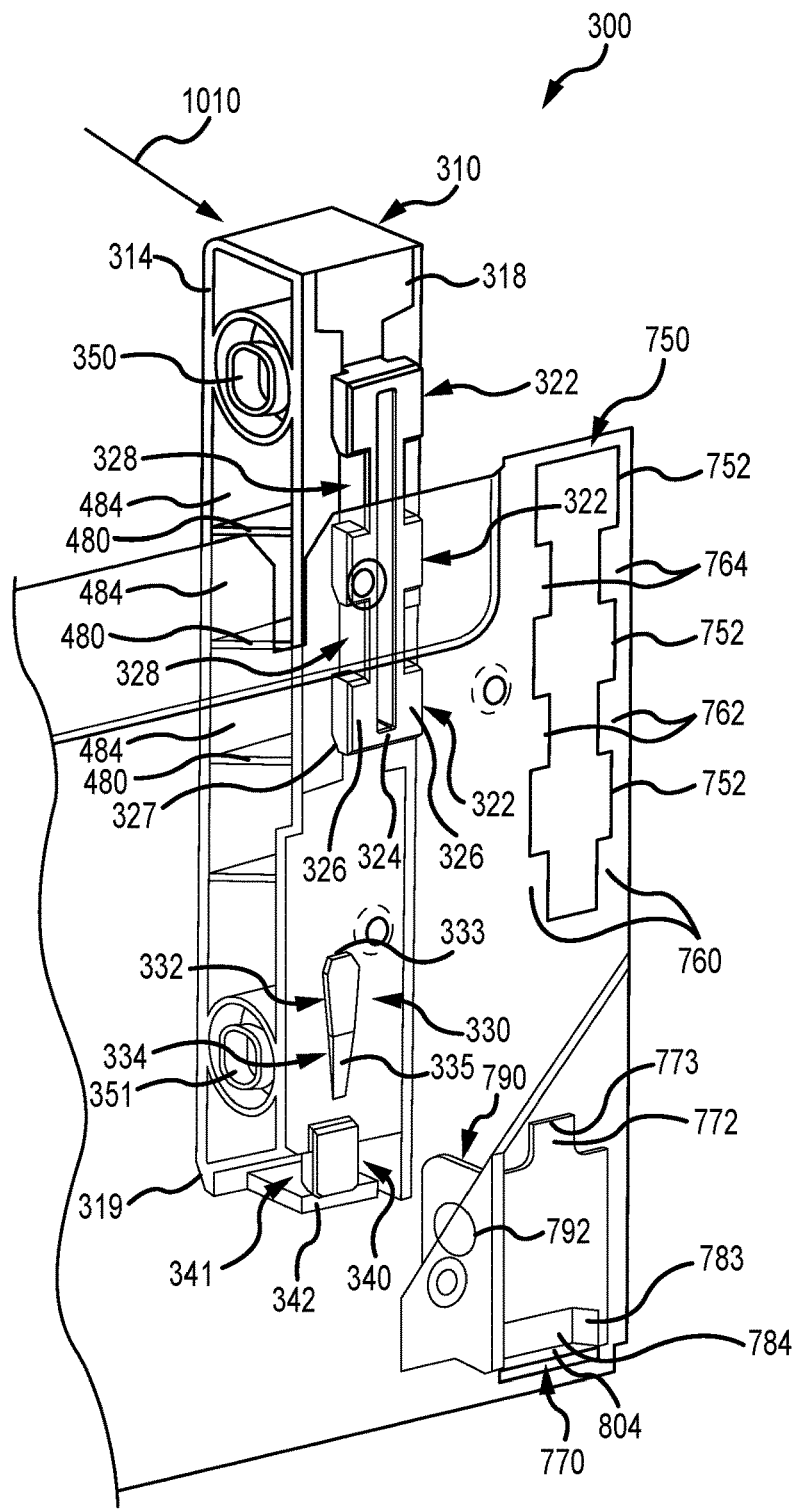
FIGS. 10A-10C show steps of assembling the rack-mountable system of FIGS. 7-9 or of snapping on (in a tool-less manner) the ear to the chassis sidewall.
Figure 10B:
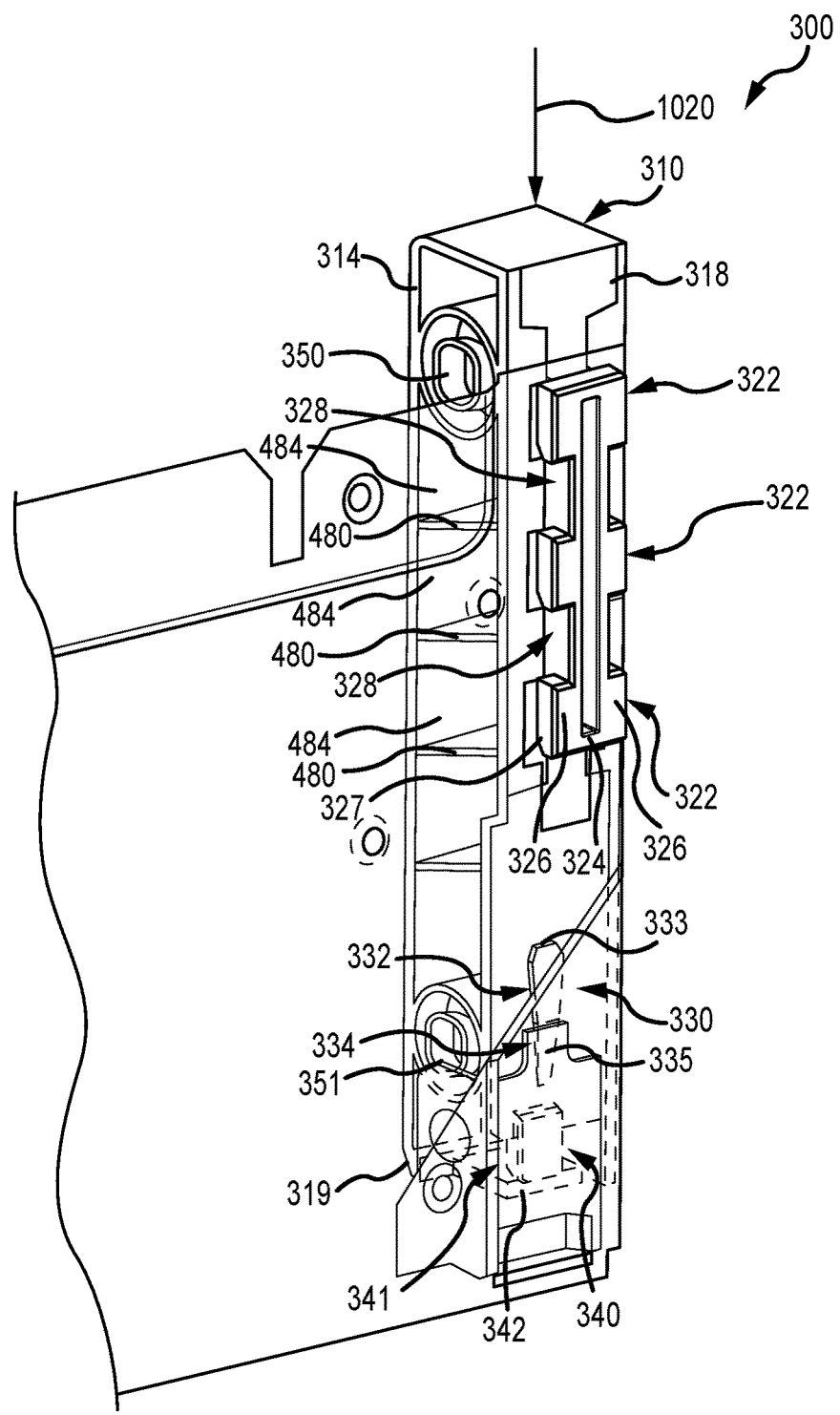
Figure 10C:
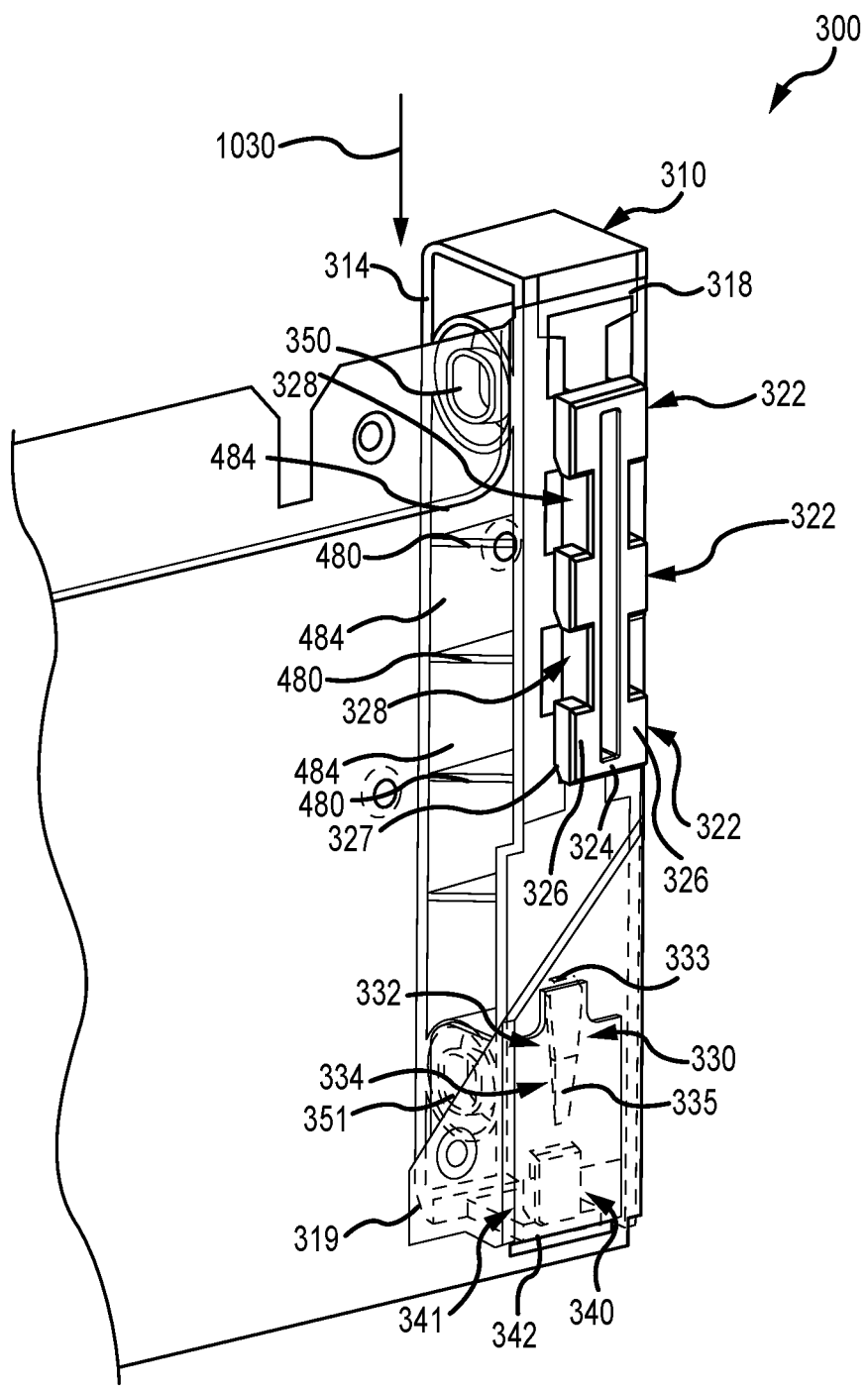

FIGS. 10A-10C illustrate a sequence for assembly of a rack-mountable system or apparatus (e.g., by mounting an ear 300 onto a chassis sidewall 740 and a similar process would be followed for the other or opposite ear (not shown) on the other or opposite chassis sidewall (not shown)). Note, these figures use like numbers as used in FIGS. 7-9 even though the assembly process is for a left (second) ear and a left (second) chassis sidewall rather than the right (first) ear and right (first) chassis sidewall shown in FIGS. 7-9.

The assembly process starts as shown in FIG. 10A with the ear 300 being positioned to the side of the chassis sidewall 740 and with the side 318 facing toward the chassis sidewall 740. The upper locking element 320 is aligned with the pattern of the upper hole 750 such that the wings/arms 322 are aligned with the wider receiving portions 752. Then, as shown with arrow 1010, the ear 300 is pressed against the side 742 of the chassis sidewall 740 such that the upper locking element 320 is received within the hole 750 (with wings/arms 322 within the receiving portions 752 of the hole 750 as can be seen in FIG. 10B).

The assembly process continues as shown in FIG. 10C. Specifically, a force (e.g., a downward force) as shown with arrow 1020 is applied on the ear 300. This causes the upper locking element 320 to move or slide within the slot or hole 750, and, particularly, for the pairs of teeth or restraining members/extensions 760, 762, 764 to slide under the arms/wings 322 of the upper locking element 320 within the gap/clearance space 690. The movement of the ear 300 and upper locking element 320 is halted as the center portion 324 of the lowest wing/arm 322 abuts or comes into contact with the edge defining the lowest narrow portion 754 of the hole 750. FIG. 10C shows the ear 300 and its locking element 320 in this final position. FIG. 10C also shows with arrow 1030 that near the end of the assembly a final or last push or application of downward force also causes the lower locking element 330 to snap into place in the lower hole 770 with the upper portion 332 fitting into the gap/narrow space 772 such that the lip/contact side 333 abuts or is in mating/restraining contact with edge 773. Concurrently, with the steps in FIGS. 10B and 10C, the tab/lower locking element 340 is pushed into the gap/space 804 between the retaining wall 780 and the sidewall 740 so that the tab/locking element 340 abuts and/or is restrained from movement away from the sidewall 740 by the center/middle member 784 of the restraining wall 780.

Figure 12:
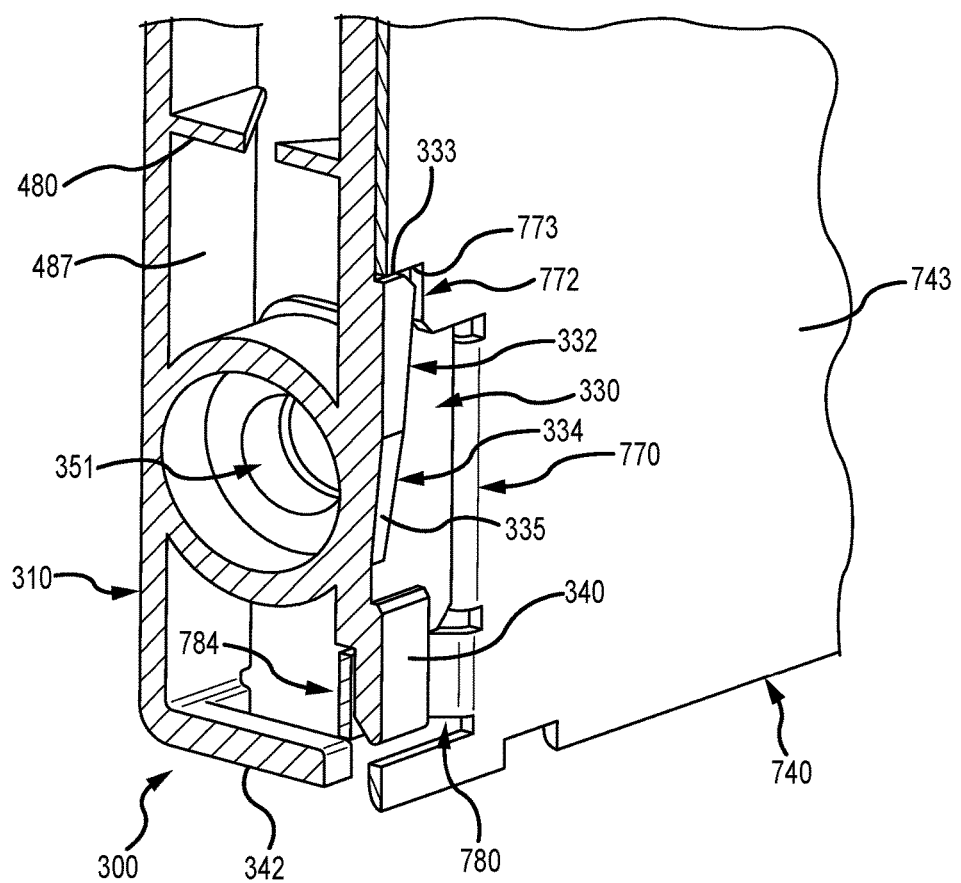
FIG. 12 illustrates a sectional view of the assembled rack-mountable system of FIG. 11 showing the lower locking elements of the ear and mating/receiving components of the chassis sidewall in further detail.

FIGS. 11 and 12 illustrate additional details of an assembled ear 300 and chassis sidewall 740 (here shown with a first or right ear with a first or right chassis sidewall of a rack-mountable system or apparatus such as apparatus 100 of FIGS. 1 and 2). As discussed above, the rack-mounting ear 300 and receiving and locking features of the chassis sidewall 740 are designed such that when these two parts are assembled together as shown that they function or act as a single object even when exposed to a variety of forces, shocks, and/or vibrations (such as when a rack containing this assembly is moved about during use). Besides rotational DOF that are controlled with this design, translational motion in the X, Y, and Z-axes are restrained.

Particularly, when assembled as shown, the interlocking or dovetailing locking element 320 is restrained from X-axis and Z-axis motion as the pairs of teeth 760, 762, 764 contact both the center member 324 of each wing/arm 322 and the extensions/cantilevered members 326 of each wing/arm 322. The snap locking feature provided by the lip/edge 333 of the lower locking element 330 and upper edge of the gap 772 in lower hole 770 acts to prevent (or minimize) Y-axis motion. The insertion of the tab/lower locking element 740 inside the space 804 the retaining wall 780 (which may be formed of sheet metal pressed out or removed from sidewall 740 to form the lower hole 770) acts to provide a slot locking feature that prevents (or minimizes) lower X-axis motion of the ear 300 relative to the chassis sidewall 740.

While this disclosure contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

We claim:

1. An apparatus for mounting in a rack used to store computer, telecommunications, electronic, and other equipment, comprising:
a chassis comprising a first sidewall and a second sidewall;
a first rack-mounting ear coupled with the first sidewall; and
a second rack-mounting ear coupled with the second sidewall,
wherein the first and second rack-mounting ears each includes a body with a pair of spaced apart fastener holes for mounting the chassis to the rack,
wherein the body is fabricated as a unitary piece,
wherein the first and second rack-mounting ears are coupled to the first and second sidewalls, respectively, in a tool-less manner without use of separate fasteners,
wherein the body includes an upper locking element comprising at least one wing portion and at least one recessed portion, the wing portion including a center member extending outward from a surface of the body and a pair of extension members extending outward from opposite sides of the center member,
wherein each of the extension members is spaced apart from the surface of the body by a gap, and
wherein the wing portion has a width that is greater than a width of the recessed portion.

2. The apparatus of claim 1, wherein the body is fabricated of plastic.

3. The apparatus of claim 2, wherein the plastic is a thermoplastic.

4. The apparatus of claim 1, wherein the first and second sidewalls each includes an upper hole for receiving one of the upper locking elements when the first and second rack-mounting ears are coupled with the first and second sidewalls of the chassis, wherein the upper hole includes at least one wing-receiving portion and, adjacent the wing-receiving portion, a pair of inward-extending portions, wherein the wing-receiving portion has a first width greater than the width of the wing portion of the upper locking element and the pair of inward-extending portions define a space within the upper hole with a second width less than the first width, and wherein the pair of inward-extending portions are positioned within the gaps between the surface of the body and the extension members, whereby motion of the upper locking element is restrained.

5. An apparatus for mounting in a rack used to store computer, telecommunications, electronic, and other equipment, comprising:
a chassis comprising a first sidewall and a second sidewall;
a first rack-mounting ear coupled with the first sidewall; and
a second rack-mounting ear coupled with the second sidewall,
wherein the first and second rack-mounting ears each includes a body with a pair of spaced apart fastener holes for mounting the chassis to the rack,
wherein the body is fabricated as a unitary piece,
wherein the first and second rack-mounting ears are coupled to the first and second sidewalls, respectively, in a tool-less manner without use of separate fasteners,
wherein the body includes a first lower locking element extending outward a distance from a surface of the body, wherein the first and second sidewalls of the chassis each includes a lower hole for receiving the locking element of one of the first and second rack-mounting ears when the first and second rack-mounting ears are coupled with the first and second sidewalls of the chassis, wherein the first lower locking element comprises a lower portion with a sloped outer surface and an upper portion with a lip for abutting a retaining edge of the lower hole when the first lower locking element is placed into the lower hole, whereby motion of the first lower locking element is restrained in a direction toward the retaining edge.

6. The apparatus of claim 5, wherein the body further includes a second lower locking element comprising a tab extending outward from an end of the surface of the body, wherein each of the first and second sidewalls of the chassis further includes a retaining wall extending over the lower hole and being spaced apart from the lower hole, and wherein the tab is inserted into a space between the retaining wall and the lower hole, whereby motion of the second lower locking element in a direction away from the lower hole is restrained by the retaining wall.

7. A rack-mountable system, comprising:
a chassis; and
a first ear and a second ear attached to the chassis and adapted for mounting the chassis to a rack,
wherein the chassis comprises a first sidewall and a second sidewall opposite the first sidewall,
wherein the first and second sidewalls each includes an upper hole and a lower hole,
wherein the first ear comprises an upper locking element positioned within the upper hole of the first sidewall and a lower locking element positioned within the lower hole of the first sidewall,
wherein the second ear comprises an upper locking element positioned within the upper hole of the second sidewall and a lower locking element positioned within the lower hole of the second sidewall,
wherein the upper holes each comprises an alternating pattern of spaces with a first width and spaces with a second width less than the first width,
wherein the upper locking element comprises a plurality of spaced and parallel arms each with a width less than the first width and greater than the second width, and
wherein a gap is provided under each of the arms for receiving a portion of one of the first and second sidewalls to restrain translational movement of the upper locking element in at least one direction.

8. The system of claim 7, wherein the first and second ears each comprises a unitary body formed of plastic.

9. A rack-mountable system, comprising:
a chassis; and
a first ear and a second ear attached to the chassis and adapted for mounting the chassis to a rack,
wherein the chassis comprises a first sidewall and a second sidewall opposite the first sidewall,
wherein the first and second sidewalls each includes an upper hole and a lower hole,
wherein the first ear comprises an upper locking element positioned within the upper hole of the first sidewall and a lower locking element positioned within the lower hole of the first sidewall,
wherein the second ear comprises an upper locking element positioned within the upper hole of the second sidewall and a lower locking element positioned within the lower hole of the second sidewall,
wherein the lower locking elements each extends outward a distance from a surface of one of the first and second ears, wherein the lower locking elements each comprises a lower portion with a sloped outer surface and an upper portion with a lip abutting a retaining edge of the lower hole when the lower locking element is placed into the lower hole, whereby motion of the lower locking element is restrained in a direction toward the retaining edge.

10. A rack-mountable system, comprising:
a chassis;
a first ear and a second ear attached to the chassis and adapted for mounting the chassis to a rack, wherein the chassis comprises a first sidewall and a second sidewall opposite the first sidewall, wherein the first and second sidewalls each includes an upper hole and a lower hole, wherein the first ear comprises an upper locking element positioned within the upper hole of the first sidewall and a lower locking element positioned within the lower hole of the first sidewall, and wherein the second ear comprises an upper locking element positioned within the upper hole of the second sidewall and a lower locking element positioned within the lower hole of the second sidewalk; and
an additional lower locking element on each of the first and second ears, the additional lower locking element comprising a tab extending outward from an end of a surface of one of the first and second ears, wherein each of the first and second sidewalls of the chassis further includes a retaining wall extending over the lower hole and being spaced apart from the lower hole, and wherein the tabs are each positioned in a space between the retaining wall and the lower hole of the first and second sidewalls, whereby motion of the additional lower locking element in a direction away from the lower hole is restrained by the retaining wall.

11. An apparatus for mounting in a rack, comprising:
a chassis comprising a first sidewall and a second sidewall opposite the first sidewall;
a first rack-mounting mechanism attached to the first sidewall; and
a second rack-mounting mechanism attached to with the second sidewall,
wherein the first and second rack-mounting mechanisms each includes a body with a pair of spaced apart fastener holes for mounting the chassis to the rack,
wherein the body includes an upper locking element comprising at least one wing portion and at least one recessed portion, the wing portion including a center member extending outward from a surface of the body and a pair of extension members extending outward from opposite sides of the center member, wherein each of the extension members is spaced apart from the surface of the body by a gap, and wherein the wing portion has a width that is greater than a width of the recessed portion, and
wherein the first and second sidewalls each includes an upper hole for receiving one of the upper locking elements when the first and second rack-mounting ears are coupled with the first and second sidewalls of the chassis, wherein the upper hole includes at least one wing-receiving portion and, adjacent the wing-receiving portion, a pair of inward-extending portions, wherein the wing-receiving portion has a first width greater than the width of the wing portion of the upper locking element and the pair of inward-extending portions define a space within the upper hole with a second width less than the first width, and wherein the pair of inward-extending portions are positioned within the gaps between the surface of the body and the extension members, whereby motion of the upper locking element is restrained.

12. The apparatus of claim 11, wherein the body is fabricated of plastic as a unitary piece.

13. The apparatus of claim 12, wherein the plastic is a thermoplastic.

14. The apparatus of claim 11, wherein the body includes a first lower locking element extending outward from the surface of the body and wherein the first and second sidewalls of the chassis each includes a lower hole for receiving one of the first lower locking elements when the first and second rack-mounting ears are coupled with the first and second sidewalls of the chassis.

15. The apparatus of claim 14, wherein the first lower locking element comprises a lower portion with a sloped outer surface and an upper portion with a lip for abutting a retaining edge of the lower hole when the first lower locking element is placed into the lower hole, whereby motion of the first lower locking element is restrained in a direction toward the retaining edge.

16. The apparatus of claim 15, wherein the body further includes a second lower locking element comprising a tab extending outward from an end of the surface of the body, wherein each of the first and second sidewalls of the chassis further includes a retaining wall extending over the lower hole and being spaced apart from the lower hole, and wherein the tab is inserted into a space between the retaining wall and the lower hole, whereby motion of the second lower locking element in a direction away from the lower hole is restrained by the retaining wall.

17. The apparatus of claim 5, wherein the body is fabricated of plastic.

18. The apparatus of claim 17, wherein the plastic is a thermoplastic.

19. The system of claim 9, wherein the first and second ears each comprises a unitary body formed of plastic.

20. The system of claim 10, wherein the first and second ears each comprises a unitary body formed of plastic.

* * * * *

UNITED STATES PATENT AND TRADEMARK OFFICE
CERTIFICATE OF CORRECTION

PATENT NO. : 10,051,758 B2  
APPLICATION NO. : 15/259449  
DATED : August 14, 2018  
INVENTOR(S) : Andres Gabriel Hofmann and Eric Munro Innes Page 1 of 1

It is certified that error appears in the above-identified patent and that said Letters Patent is hereby corrected as shown below:

In the Claims

Column 14, Line 11, delete "sidewalk" and insert therefor --sidewall--.

Signed and Sealed this  
Fifth Day of February, 2019

Andrei Iancu  
*Director of the United States Patent and Trademark Office*